US 6,710,616 B1

(12) United States Patent
D'Souza

(10) Patent No.: US 6,710,616 B1
(45) Date of Patent: Mar. 23, 2004

(54) WAFER LEVEL DYNAMIC BURN-IN

(75) Inventor: Daniel B. D'Souza, Monte Sereno, CA (US)

(73) Assignee: LSI Logic Corporation, Milpitas, CA (US)

( * ) Notice: Subject to any disclaimer, the term of this patent is extended or adjusted under 35 U.S.C. 154(b) by 25 days.

(21) Appl. No.: 09/918,183

(22) Filed: Jul. 30, 2001

(51) Int. Cl.$^7$ .................. G01R 31/26; G11C 29/00
(52) U.S. Cl. .............. 324/765; 324/158.1; 714/718; 365/201
(58) Field of Search ................ 324/765, 754, 324/760, 763, 761; 365/201; 361/201; 714/727, 734, 718

(56) References Cited

U.S. PATENT DOCUMENTS

| | | | | |
|---|---|---|---|---|
| 5,241,266 A | * | 8/1993 | Ahmad et al. ............ 714/733 |
| 5,254,942 A | | 10/1993 | D'Souza et al. ........... 714/727 |
| 5,329,471 A | * | 7/1994 | Swoboda et al. ............ 703/23 |
| 5,396,170 A | | 3/1995 | D'Souza et al. ........... 714/729 |
| 5,408,129 A | * | 4/1995 | Farmwald et al. .......... 257/692 |
| 5,898,186 A | * | 4/1999 | Farnworth et al. ........... 257/48 |
| 6,233,184 B1 | * | 5/2001 | Barth et al. ................ 365/201 |
| 6,404,660 B1 | * | 6/2002 | Gamini et al. ............... 365/51 |
| 6,411,116 B1 | * | 6/2002 | DeHaven et al. .......... 324/765 |
| 6,504,359 B2 | * | 1/2003 | Polney .................... 324/158.1 |

* cited by examiner

Primary Examiner—Evan Pert
Assistant Examiner—Paresh Patel
(74) Attorney, Agent, or Firm—Trexler, Bushnell, Giangiorgi & Blackstone, Ltd.

(57) ABSTRACT

A design which allows burn-in of DRAM's at the wafer level, as opposed to in die form or after the package has been assembled. The DRAM dies on the wafer are IEE1149.1 (JTAG) compliant, and the TDO pad of each die is connected to the TDI pad of the next die. The dies are arranged in rows, and each die in a given row is daisy chained to the next die in the row. The last die in the row is daisy chained to the first die in the next row. Additionally, the TMS and TCK pads of the dies are connected in parallel, such as via metal lines running along the scribe area of the wafer. The DRAM dies on the wafer are also connected to power busses along the scribe area so that the individual dies can be powered.

5 Claims, 1 Drawing Sheet

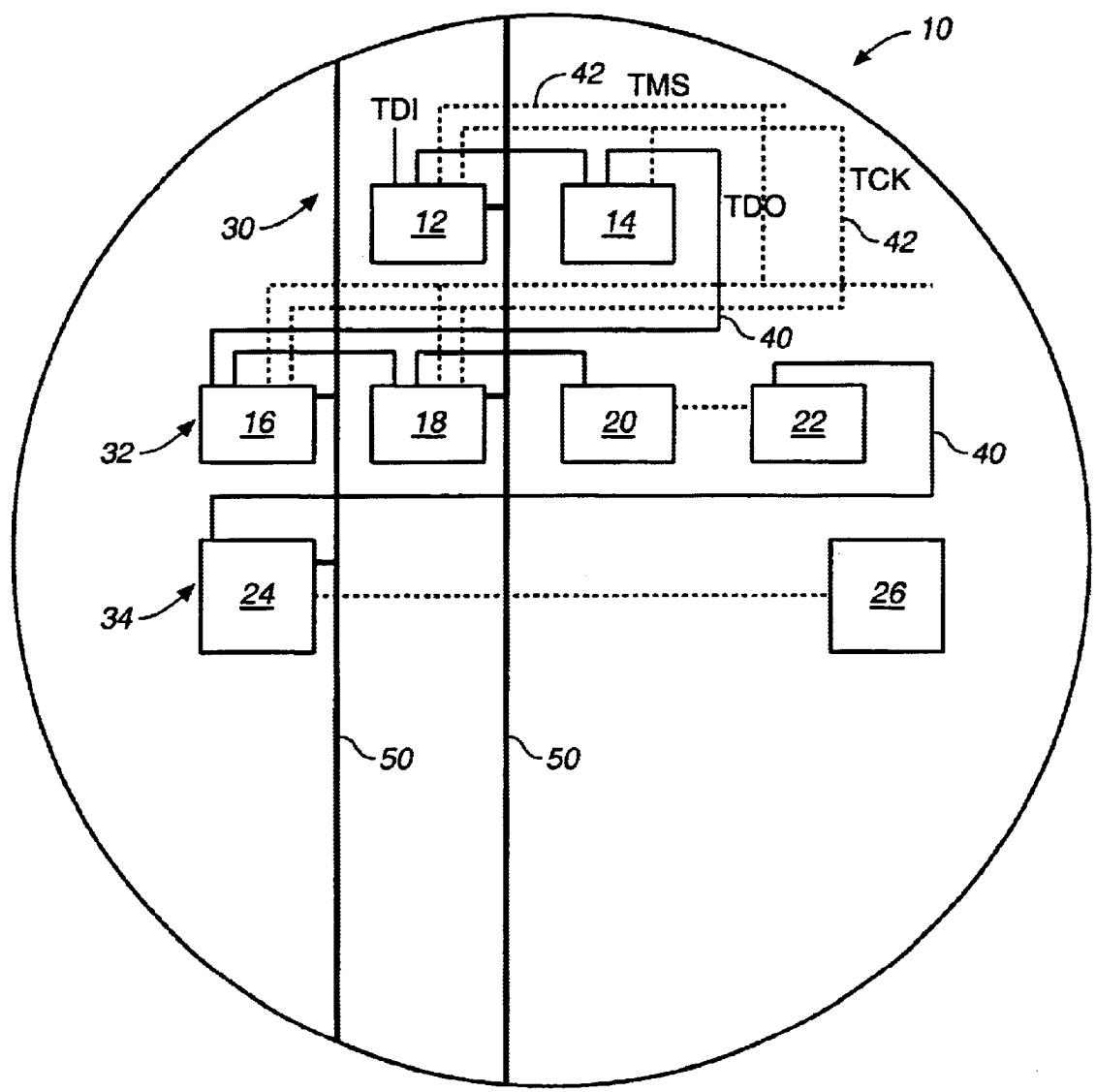
FIG._1

WAFER LEVEL DYNAMIC BURN-IN

FIELD OF THE INVENTION

This invention generally related to the manufacture of semiconductors, and more specifically relates to a design which allows burn-in of DRAM's at the wafer level, as opposed to in die form or after the package has been assembled.

BACKGROUND OF THE INVENTION

When manufacturing semiconductors (and related devices and systems), it is important to run the device under voltage and temperature stress conditions for a short period of time, usually 48 hours, to ensure that all components work properly, and continue to do so for a period of time. This testing process is called "burn-in", and provides at least some assurance that the device will work in the field, at least for a period of time.

Some multi-chip modules or packages (MCM's) include DRAM's. All of the DRAM's in an MCM must go through burn-in in order to weed out (i.e. discover) infant mortality. With existing processes, the DRAM's have to be burnt-in either in die form or in the final assembled package with the other dice in the package. Without burning-in the DRAM's, DPPM (Defective Parts Per Million) can be easily over 10,000.

Currently, the best alternative is to burn-in the DRAM's in die form. However, this requires that special die packages be built, and this can be quite costly. In fact, the cost can be in the order of tens of millions of dollars.

While burning in the DRAM's after the package has been assembled is a possibility, this is also costly due to the fact that the entire package has to be discarded if any of the DRAM's in the package fails.

Neither burn-in method (i.e. burn-in when the DRAM is in die form, and burn-in after the package has been assembled) allows burn-in to be performed with simple wafer sort probing equipment.

OBJECTS AND SUMMARY

A general object of an embodiment of the present invention is to provide a design which allows burn-in of DRAM's at the wafer level, as opposed to in die form or after the package has been assembled.

Another object of an embodiment of the present invention is to provide a design which allows burn-in to be performed with simple wafer sort probing equipment.

Briefly, and in accordance with at least one of the foregoing objects, an embodiment of the present invention provides a DRAM wafer that includes a plurality of DRAM dies daisy chained together. The DRAM dies are daisy chained in that an output pad of one DRAM die is connected to the input pad of a next DRAM die on the wafer, etc., etc.

Preferably, the DRAM dies are IEE1149.1 (JTAG) compliant, and include the following pads: TDI (Test Data In), TDO (Test Data Out), TCK (Test Clock) and TMS (Test Mode Set). The TDO pad of each DRAM die is connected to the TDI pad of the next DRAM die on the wafer. Additionally, the TMS and TCK pads of the DRAM dies are connected in parallel, such as via metal lines running along the scribe area of the wafer.

Preferably, the DRAM dies on the wafer are arranged in rows, and each DRAM die in a given row is daisy chained to the next DRAM die in the row (i.e. the TDO pad of each DRAM die in the row is connected to the TDI pad of the next DRAM die in the row), and the last DRAM die in the row is daisy chained to the first DRAM die in the next row (i.e. the TDO pad of the last DRAM die in a given row is connected to the TDI pad of the first DRAM die in the next row). Preferably, the last DRAM die in a given row is daisy chained to the first DRAM die in the next row via a metal line on the scribe area of the wafer. The DRAM dies on the wafer are connected to power busses along the scribe area so that the individual dies can be powered.

BRIEF DESCRIPTION OF THE DRAWINGS

The organization and manner of the structure and operation of the invention, together with further objects and advantages thereof, may best be understood by reference to the following description, taken in connection with the accompanying drawing, wherein FIG. 1 is a simplified diagram of a SDRAM wafer which is in accordance with an embodiment of the present invention, wherein the design provides that burn-in can be performed at the wafer level using simple wafer sort probing equipment.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 illustrates a wafer configuration which is in accordance with an embodiment of the present invention. The design shown in FIG. 1 allows burn-in of DRAM's to be performed at the wafer level, as well as allows burn-in to be performed using simple wafer sort probing equipment.

As shown, the design provides an SDRAM wafer 10 which includes SDRAM dies 12, 14, 16, 18, 20, 22, 24, 26 that are daisy chained together on the wafer 10. The design is based on IEE1149.1 (JTAG). Hence, every DRAM die on the wafer has the following four (4) pads:
1) TDI (Test Data In)
2) TDO (Test Data Out)
3) TCK (Test Clock)
4) TMS (Test Mode Set).

As illustrated in FIG. 1, the SDRAM dies are provided in rows (FIG. 1 shows a first row 30, a second row 32, and a third row 34) on the wafer 10 and are daisy chained in that the TDI and TDO pads of each of the SDRAM dies are connected. Specifically, the TDO pad of a given SDRAM die is connected to the TDI pad of the next SDRAM in the same row, and the TDO pad of that next SDRAM die in the row is connected to the TDI pad of the next SDRAM in the row, etc. etc. The TDO pad from the last die of a given row (i.e. 14 and 22) is connected to the TDI pad of the first die in the next row (i.e. 16 and 24), via a metal line 40 on the scribe area. The TMS and TCK pads of all of the SDRAM dies on the wafer are connected in parallel via metal lines 42 running along the scribe area. In order to be able to power the individual dies, the power pads of each of the SDRAM dies are connected to power busses 50 on the wafer 10 along the scribe area.

If any bad DRAM dice have to be skipped, these can be identified easily via standard wafer sort techniques, and then can be programmed in the bypass mode during burn-in.

During burn-in, only the first die (i.e. 12) needs to be probed with four signal probes for the signals mentioned above (i.e. TDI, TDO, TCK and TMS) and additional power (i.e. $V_{DD}$) and ground probes. Connections from these four probes can be taken out from the back plane of the burn-in oven. If each DRAM die has BIST (built-in self test) structures, these can be activated via the IEEE1149.1 RUNBIST instruction.

The DRAM dies can be exercised via very low cost Automated Test Equipment (ATE) with as few as eight (8) channels only and speeds as low as 1 MHZ. The high level algorithm for exercising the DRAM is as follows:

1) Configure the boundary scan of all the die (12, 14 . . . 26) so that they are in shift mode. This can be achieved by loading the appropriate instruction in the instruction register for each die.

2) Shift in the address and data serially via the TDI pad from the first die (12). This can be achieved via the shift instruction.

3) Clock the data into the respective address set up in step 2 above.

4) Repeat steps 2 and 3 for the next address and new data.

5) After all the addresses have been reached, either repeat the sequence or start with a new data sequence or address sequence.

As discussed above, preferably the DRAM dies are IEE1149.1 (JTAG) compliant. This is advantageous because software and ATE support already exists in the industry for this standard.

While an embodiment of the present invention is shown and described, it is envisioned that those skilled in the art may devise various modifications of the present invention without departing from the spirit and scope of the appended claims.

What is claimed is:

1. A wafer comprising:

a plurality of DRAM dies on the wafer, wherein each DRAM die has a test data in pad and a test data out pad; and conductive connections interconnecting the test data out and test data in pads of the DRAM dies, said conductive connection providing that said DRAM's can be burned-in on the wafer, wherein the DRAM dies on the wafer are arranged in rows, wherein each row comprises a plurality of DRAM dies and each DRAM die in a given row is daisy chained to the next DRAM die in the row, wherein the last DRAM die in a row is daisy chained to the first DRAM die in the next row via a metal line on a scribe area of the wafer, wherein the DRAM dies on the wafer are connected to power busses along a scribe area so that the dies can be powered.

2. The wafer as recited in claim 1, wherein the DRAM dies are IEE1149.1 (JTAG) compliant, and include the following pads: TDI (Test Data In), TDO (Test Data Out), TCK (Test Clock) and TMS (Test Mode Set).

3. The wafer as recited in claim 2, wherein the TDO pad of each DRAM die is connected to the TDI pad of the next DRAM die on the wafer.

4. The wafer as recited in claim 2, wherein the TMS and TCK pads of the DRAM dies are connected in parallel.

5. The wafer as recited in claim 4, wherein the TMS and TCK pads of the DRAM dies are connected via metal lines running along a scribe area of the wafer.

* * * * *